United States Patent
Pazidis et al.

(10) Patent No.: US 8,488,103 B2
(45) Date of Patent: Jul. 16, 2013

(54) OPTICAL ELEMENT FOR REFLECTION OF UV RADIATION, METHOD FOR MANUFACTURING THE SAME AND PROJECTION EXPOSURE APPARATUS COMPRISING THE SAME

(75) Inventors: Alexandra Pazidis, Essingen-Lautenburg (DE); Christoph Zaczek, Heubach (DE); Horst Feldermann, Aalen (DE); Peter Huber, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 321 days.

(21) Appl. No.: 12/780,035

(22) Filed: May 14, 2010

(65) Prior Publication Data

US 2010/0290021 A1 Nov. 18, 2010

Related U.S. Application Data

(63) Continuation of application No. PCT/EP2008/009512, filed on Nov. 12, 2008.

(60) Provisional application No. 60/987,969, filed on Nov. 14, 2007.

(30) Foreign Application Priority Data

Nov. 14, 2007 (DE) .................. 10 2007 054 731

(51) Int. Cl.
*G03B 27/54* (2006.01)
*G03B 27/42* (2006.01)
*G02B 5/08* (2006.01)

(52) U.S. Cl.
USPC ............................... 355/67; 355/53; 359/360

(58) Field of Classification Search
USPC .. 355/53, 67, 55; 359/360, 584, 359; 362/341
See application file for complete search history.

(56) References Cited

U.S. PATENT DOCUMENTS

| 4,856,019 A | 8/1989 | Miyata et al. |
| 5,042,887 A * | 8/1991 | Yamada ..................... 359/360 |

(Continued)

FOREIGN PATENT DOCUMENTS

| EP | 1 767 978 A1 | 3/2007 |
| JP | 2038569 A | 2/1990 |

(Continued)

OTHER PUBLICATIONS (Various Authors) Semiconductor Substrates: Epitaxy and Growth, presented at "Verhandlungen der Deutschen Physikalischen Gesellschaft e.V., Regensburg [Germany] 2007: Section Surface Physics", Mar. 26-30, 2007.

(Continued)

*Primary Examiner* — Peter B Kim
(74) *Attorney, Agent, or Firm* — Sughrue Mion, PLLC

(57) ABSTRACT

An optical element (1a, 1b) for reflecting UV radiation at an operating wavelength below 250 nm, preferably at 193 nm, which has a substrate (2a, 2b), a reflective layer (3a, 3b) made of aluminum superimposed on the substrate (2a, 2b). The reflective aluminum layer (3a, 3b) is not transparent to UV radiation and is (111)-plane oriented. The reflective optical element (1a, 1b) has a reflectivity of more than 85%, preferably of more than 88%, and even more preferably of more than 92%, in a range of incident angles of at least 10°, preferably of at least 15°, at the operating wavelength. Also disclosed is an optical element having a reflective layer made from a material having a melting point higher than that of aluminum, as well as methods for producing such optical elements, and optical arrangements incorporating such optical elements.

9 Claims, 3 Drawing Sheets

U.S. PATENT DOCUMENTS

| | | |
|---|---|---|
| 5,265,143 A | 11/1993 | Early et al. |
| 5,850,309 A | 12/1998 | Shirai et al. |
| 6,310,905 B1 | 10/2001 | Shirai |
| 6,665,126 B2 | 12/2003 | Shafer et al. |
| 6,956,694 B2 | 10/2005 | Shafer et al. |
| 7,033,679 B2 | 4/2006 | Okura et al. |
| 7,331,695 B2 | 2/2008 | Ohmi et al. |
| 2005/0213199 A1 | 9/2005 | Imai et al. |
| 2006/0215409 A1 | 9/2006 | Ohmi et al. |
| 2006/0262389 A1 | 11/2006 | Zaczek |
| 2007/0144892 A1 | 6/2007 | Shih et al. |
| 2008/0273185 A1 | 11/2008 | Omura et al. |

FOREIGN PATENT DOCUMENTS

| | | |
|---|---|---|
| JP | 2278203 A | 11/1990 |
| JP | 5267570 A | 10/1993 |
| JP | 11311704 A | 11/1999 |
| JP | 2006/227099 A | 8/2006 |
| JP | 2006210715 A | 8/2006 |
| WO | 2004013374 A2 | 2/2004 |
| WO | 2004/019128 A2 | 3/2004 |
| WO | 2005069055 A2 | 7/2005 |
| WO | 2006053705 A1 | 5/2006 |

OTHER PUBLICATIONS

Kaiser, N., "Review of the Fundamentals of Thin-Film Growth", Applied Optics, vol. 41, No. 16, Jun. 1, 2002, pp. 3053-3060.

* cited by examiner

OPTICAL ELEMENT FOR REFLECTION OF UV RADIATION, METHOD FOR MANUFACTURING THE SAME AND PROJECTION EXPOSURE APPARATUS COMPRISING THE SAME

CROSS-REFERENCE TO RELATED APPLICATIONS

This is a Continuation of International Application PCT/EP2008/009512, with an international filing date of Nov. 12, 2008, which was published under PCT Article 21(2) in English, and the complete disclosure of which is incorporated into this application by reference; the International Application, in turn, claims benefit of U.S. Provisional Application No. 60/987,969, filed Nov. 14, 2007, and of DE 10 2007 054 731.7-51, also filed Nov. 14, 2007, both of which are also incorporated into this Continuation by reference.

FIELD OF AND BACKGROUND TO THE INVENTION

The present invention relates to an optical element configured to reflect ultraviolet (UV) radiation at an operating wavelength below 250 nm, preferably at 193 nm, comprising: a substrate, and a reflective layer made of aluminum superimposed on the substrate, wherein the reflective aluminum layer is not transparent to the UV radiation. The invention also relates to an optical element configured to reflect UV radiation at an operating wavelength below 250 nm, preferably at 193 nm, comprising: a substrate, a reflective layer superimposed on the substrate made from a basic material which is not transparent to the UV radiation, the basic material preferably being metallic or semi-conductive, and a dielectric multi-layer system superimposed on the reflective layer, wherein the reflective optical element has a reflectivity of more than 85%, preferably of more than 88%, and even more preferably of more than 92%, over at least a range of incident angles of 10°, preferably of 15°. The invention also relates to optical arrangements for microlithography having an optical element of this kind, and to methods for manufacturing such an optical element.

Optical elements for the reflection of UV radiation (typically between 120 nm and 250 nm) are used, for example, in projection exposure apparatus for microlithography for beam deflection and/or folding of the beam path. Such optical elements are intended to make the reflectivity for incident radiation as high as possible over a range of incident angles that is as wide as possible. Usually, a dielectric multi-layer system is superimposed on a reflective layer consisting of a basic material, the multi-layer system being adapted to increase the reflectivity of the optical element due to interference effects. For example, the use of aluminum, silver, gold or platinum as a basic material for optical elements reflecting in the visual wavelength range is known. For the UV and/or VUV wavelength range usually only aluminum is used as a basic material since in other metals, as a rule, the plasma edge is in the wavelength range above the radiation used.

From U.S. Pat. No. 7,033,679 B2 it is known to select as a basic material a single-crystalline metallic layer with a high package density for an optical element reflective in the visual wavelength range, of which the surface roughness is very small and onto which a multi-layer system with enhanced reflectivity is superimposed. In the case of basic materials other than aluminum, e.g. chromium, however, the reflectivity of the optical element is distinctly below 90% once the wavelength of the radiation used is approaching the UV wavelength range.

U.S. Pat. No. 6,956,694 B2 discloses reflective layers which are used in a catadioptric projection lens for UV radiation. Among others, aluminum has been specified as a basic material for these layers having a reflectivity of more than 90% in this wavelength range. Moreover, molybdenum, tungsten and chromium have been specified as materials for these layers, the reflectivity in the UV range of which, however, is only at approximately 60%.

The reflectivity of an optical element does not only depend on the characteristics of the basic material. The reflectivity may even be enhanced if, as described in the applicant's WO 2006/053705 A1, a layer of tantalum which has good heat conductivity and is assumed to enable an oriented growth of the aluminum layer is deposited between the aluminum layer and the subjacent substrate in the case of a dielectrically protected metallic mirror.

Further to achieving a degree of reflection as high as possible other factors are still relevant concerning the quality of a reflective optical element. According to general knowledge, a difference in reflectivity and a phase difference depending on the incident angle generally occurs between radiation impinging on the reflective surface with an electrical field intensity vector parallel to the incident plane (p-polarized radiation), and radiation in which the field intensity vector is perpendicular to the incident plane (s-polarized radiation). Both the difference in reflectivity and the phase difference ought to be as small as possible across the range of incident angles of interest, since both of them may deteriorate the image-forming properties of the optical system, in which the reflective optical element is arranged, if no appropriate action is taken to compensate these effects. In deflective mirrors, the range of incident angles of interest typically is in an angular range of about 45°, the width thereof is varying in dependence of the optical design used, e.g., between 40° and 50° or between 35° and 55°.

An optical element of the aforementioned type for reflection of UV radiation which is assumed to have little fluctuation in polarization reflectivity over a wide range of incident angles is known from U.S. Pat. No. 6,310,905 B1. Therein a specific sequence of single layers is used which layers are superimposed on an aluminum layer serving as the basic material, in order to achieve a variation as small as possible of the reflectivity over the range of incident angles used.

EP 1767978A1 discloses an optical system comprising at least one deflective mirror. Radiation impinges over a wide range of incident angles onto this mirror. Upon reflection the at least one deflective mirror produces a change in the phase difference between s- and p-polarized radiation of a maximum of 30° over the total range of incident angles. Besides aluminum, silver, silicon, germanium, molybdenum and ruthenium as well have been identified as a basic material for the deflective mirror. Typically, three to four dielectric layers are superimposed onto the basic material.

U.S. Pat. No. 7,331,695 B2 discloses a visible light-reflecting member which uses a plate or a film for reflecting visible light, whose reflective surface is provided with an aluminum layer having high purity and (111) as the main plane orientation. The (111)-plane oriented aluminum layer is supposed to have increased reflectivity for visible light compared to amorphous aluminum layers. The (111) plane orientation is generated by sputtering using a bias voltage.

However, when coating a substrate with an aluminum layer for UV wavelengths, only a very limited range of coating parameters (very low pressure, high coating rate, low coating temperature) is available to achieve optimum results. Specifically, the roughness of the aluminum layer rises with a rise in the coating temperature, oxidation, and when using ion- or plasma assisted coating techniques, whereby the stray light portion increases and the reflection decreases. Thus, forming an aluminum layer by sputtering—as described in U.S. Pat. No. 7,331,695 B2—is not a viable option for producing an aluminum layer for UV/VUV applications, as the reflectivity of the aluminum layer thus produced is too low.

It was also discovered that upon application of high-power laser radiation the aluminum layer is roughened even when said layer is protected, e.g. by a protective layer consisting of chiolithe or a dielectric multiple-layer system.

Moreover, the inventors have observed that upon superimposing a dielectric multi-layer system onto the aluminum layer with a single layer or plural layers being superimposed through coating processes involving high energy the roughness of the aluminum surface does not decrease as is the case with other basic materials, but on the contrary, frequently increases.

OBJECT OF THE INVENTION

An object of the present invention is to provide optical elements, methods for manufacturing such optical elements and optical arrangements for microlithography comprising such optical elements, in which the surface roughness of the reflective layer is comparably low and preferably does not increase distinctively even upon an extensive irradiation and/or upon the deposition of layers involving a high energy input.

SUMMARY OF THE INVENTION

One aspect of the invention is realized in an optical element of the first kind mentioned in the introduction, wherein the reflective aluminum layer is (111)-plane oriented, and wherein the reflective optical element has a reflectivity of more than 85%, preferably of more than 88%, more preferably of more than 92%, in a range of incident angles of at least 10°, preferably of 15°, at the operating wavelength.

The inventors have found that it is possible to form a reflective aluminum layer with a (111)-plane orientation using a production process, in particular heteroepitaxial growth, which—in contrast to the sputtering process described in U.S. Pat. No. 7,331,695 B2—does not decrease the reflectivity of the aluminum layer for UV wavelengths by increasing its surface roughness. Consequently, it is possible to increase the reflectivity of an optical element for UV radiation by making use of the enhanced reflectivity of a (111)-plane oriented reflective aluminum layer.

The term "(111)-plane orientation" as described herein may be defined as in U.S. Pat. No. 7,331,695 B2, namely in that among the peaks attributed to aluminum measured in Θ-2Θ X-ray diffraction, the peak intensity attributed to (111) planes is higher than the total of the other peak intensities attributed to aluminum. It will be understood that in order to achieve a high reflectivity of the aluminum layer and thus of the reflective optical element, the purity of the aluminum should be 99 mass % or more.

In one embodiment, the reflective aluminum layer is superimposed on a base material having a hexagonal surface structure. Aluminum has a cubic lattice structure, so that the (111)-plane of aluminum is provided with a hexagonal structure. Therefore, a base material with a hexagonal surface structure enables the (111)-oriented growth of aluminum. The hexagonal surface structure may be produced by using a base material with a cubic lattice, in which case the (111)-plane of the base material forms a hexagonal surface structure which leads to (111)-plane oriented epitaxial growth of the reflective aluminum layer on the base material. Alternatively, a base material with a hexagonal lattice structure may be used, in which case the (001)-plane or the (002)-plane forms a hexagonal surface structure for the (111)-plane oriented growth of the aluminum layer.

In a further development, the ratio between two integer multiples of the lattice constants of the reflective aluminum layer in the (111)-plane and of the hexagonal surface structure of the base material differs by less than 10%, preferably by less than 7% from unity, the integer multiples of the lattice constants being chosen from a range of values between one and ten. The inventors have found that for heteroepitaxial growth of the (111)-plane oriented aluminum layer on the surface of the base material with the hexagonal structure, the difference between the lattice constants $d_{111}$ of aluminum and of the hexagonal structure of the base material, respectively integer multiples thereof, should be as small as possible. The inventors have also found that epitaxial growth of aluminum is in general difficult to achieve if only integer multiples of the lattice constants having a value larger than ten satisfy the above relation.

In a further development, the base material is selected from the group consisting of: calcium fluoride ($CaF_2$), silicon (Si), and lanthanum fluoride ($LaF_3$). For all of these materials, an integer multiple of the lattice constant in the plane forming the hexagonal structure is close to an integer multiple of the lattice constant $d_{111Al}$ of aluminum in the (111)-plane. For example, the lattice constants of aluminum $d_{111Al}$ and of silicon $d_{111Si}$ fit in a 4 to 3 ratio with a mismatch of only 2%. Thus, epitaxial growth of (111)-plane oriented aluminum on (111)-plane oriented silicon has been reported e.g. in the article "Epitaxial growth of Aluminum on Silicon (111) studied by SPA-LEED and STM" by T. Payer, C. Wiethoff, and M. Horn-von Hoegen, Verhandlungen der Deutschen Physikalischen Gesellschaft (DPG), Regensburg, 2007, see "http://www.dpg-verhandlungen.de/2007/regensburg/o24.pdf".

In one development, the substrate is made of the base material. In this case, the reflective aluminum layer may be arranged directly on the surface of the substrate. Care should be taken when preparing the substrate, i.e. the polishing and cleaning procedure should be optimized in such a way that no "polishing layer" is formed. A polishing layer is a layer of a substrate material where the crystalline structure is destroyed. This may happen if the abrasion depth of a polishing step is lower then the depth of scratches of a previous polishing step. Suitable cleaning procedures often involve dissolving of a surface layer of the substrate, thereby removing the polishing layer. When using substrates having a hexagonal lattice structure, for example $LaF_3$, the surface of the substrate typically has a hexagonal structure, such that no additional preparation is required. When base materials with a cubic lattice structure are used, for example silicon or $CaF_2$, the desired hexagonal structure can be produced by cutting the substrate along the (111)-plane. In this case, growth of the (111)-oriented aluminum layer on the substrate may also be enabled when the cutting angle deviates from the (111)-plane by less than 30°.

In another development, an interlayer formed between the substrate and the reflective aluminum layer is made of the base material. Also in this case, the (111)-plane oriented aluminum layer can be formed on the interlayer by heteroepitaxial growth. As the aluminum layer is nearly not transparent for UV radiation, the subjacent interlayer may be deposited on the substrate by any suitable coating method, for example by sputtering, the parameters of which may be chosen so that also for base materials having a cubic lattice structure, a (111)-plane oriented layer can be produced. The substrate can be made of an amorphous material in this case, e.g. of amorphous quartz glass.

In a further embodiment, a dielectric multi-layer system is superimposed on the reflective aluminum layer. Typically, although the (111)-plane oriented aluminum layer has a high reflectivity for UV radiation, a dielectric multilayer system is applied to the reflective aluminum layer to enhance the reflectivity of the optical element for UV radiation by interference effects. Using a suitable dielectric multilayer system, also the polarization-dependent difference in reflectivity for s- and p-polarized radiation as well as the polarization-dependent phase difference of these polarization components may be reduced.

In another embodiment, a protective layer of chiolite is superimposed on the reflective aluminum layer, protecting the aluminum layer from oxidation by the surrounding atmosphere. Using chiolite as a protective layer is particularly advantageous, as is described in detail in WO 2006/053705 by the applicant, the entire contents of which are incorporated herein by reference. The person skilled in the art will appreciate that other materials, e.g. manganese fluoride ($MgF_2$), may be used as a protective layer as well. It will also be understood that the protective layer may be part of a dielectric multi-layer system, the protective layer being the lowermost of the dielectric layers in this case.

In another embodiment, the substrate has a thermal conductivity of 12 W/(K m) or more, preferably of 120 W/(K m) or more. Local fusion of the aluminum layer when being irradiated may be precluded by the fact that the heat generated in the irradiation process will be quickly removed from the region of the aluminum layer. This may be achieved by using substrate materials having a high thermal conductivity.

It is known to use calcium fluoride (with a thermal conductivity of 11 W/(K m)) instead of quartz glass or glass ceramics with a low thermal conductivity (1 W/(K m)) as a substrate material to achieve a better heat dissipation when the substrate is coated with aluminum. In order to further increase the thermal conductivity, however, attempts were made hitherto to apply thin layers of a material having high thermal conductivity, e.g., tantalum, between the basic layer and the substrate as shown in the applicant's WO 2006/053705 A1 mentioned above. Since the thickness and thermal capacity of a massive substrate, however, is much higher than is the case with a thin layer, the heat in a substrate composed of a material with a high thermal conductivity may be dissipated much more efficiently and farther away from the basic layer. E.g., if a thin conductive layer is located on top of a thermally insulating substrate, the heat will be dissipated from the basic material only until the thermal capacity of the thin layer has been exhausted. It is particularly advantageous to use a substrate material with a high thermal conductivity when aluminum is used as a basic material because of its low melting point.

In a development of this embodiment, more than 95%, preferably more than 99%, of the substrate consists of silicon. Silicon has a high thermal conductivity of approx. 148 W/(K m) and is thus particularly well-suited as a substrate material.

A further aspect of the invention is implemented in an optical element of the second kind mentioned in the introduction, wherein the basic material of the reflective layer has a higher melting point than aluminum. It was recognized by the inventors that the low melting point of aluminum (about 660° C.) is responsible for the increased roughness of the aluminum layer due to irradiation, since aluminum, like any other material, has defects absorbing laser radiation, or laser radiation is transformed into heat due to the high intrinsic absorption alone. In the case of aluminum a local re-arrangement of the atoms (fusing the material locally) or chemical reactions may readily occur, whereby the roughness may be increased and the reflection decreased. The energy input produced when high-energy coating methods are used may also have similar effects comparable to those of an increased coating temperature which has a considerable impact on the layer structure (cf. Kaiser, Applied Optics, Vol. 41, No. 16, 1 Jun. 2002, p. 3053). The use of high-energy coating methods, however, is advantageous in order to produce a multi-layer system which is as durable as possible.

It is possible to compensate the rather disadvantageous refractive indices which occur in layer materials for the UV range having a higher melting point than aluminum by suitably adapted multi-layer systems, such that in contrast with the belief prevalent in the art that materials other than aluminum are not suited for use in the UV range, optical elements having a high reflectivity and a low reflectivity difference and phase difference may be provided in this case as well. Specifically, the surface roughness of the basic material and thus the formation of stray light may be kept low.

In one embodiment the basic material has a melting point of 900° C. or more, preferably of 1400° C. or more, more preferably of 2000° C. or more. Germanium, for example (MP at 937° C.), e.g., is suited as a basic material having a melting point (MP) of more than 900° C., silicon (MP at 1410° C.) as a basic material having a melting point of more than 1400° C., iridium (MP at 2410° C.) as a basic material having a melting point of more than 2000° C., molybdenum (MP at 2610° C.) or tantalum (MP at 2996° C.). The more improbable a local fusion or chemical reaction of the layer with the basic material becomes, the higher the melting point of the basic material may be chosen. According to the inventors' findings, increases in the roughness owing to local fusion may already be avoided to a very large extent if silicon is used as a basic material.

At the same time, a high reflectivity is to be guaranteed by the basic material as well. The reflectivity R of a material having a real part n of the refractive index and an imaginary part k of the refractive index with respect to air (refractive index n=1) is defined by the relation:

$$R = \frac{(n-1)^2 + k^2}{(n+1)^2 + k^2}.$$

Accordingly, a high reflectivity occurs for materials in the combinations: small real part n of the refractive index and large imaginary part k of the refractive index, such as e.g. is the case in aluminum (n=0.11, k=2.2 at 193 nm, reflectivity approx. 93%), or large real part n of the refractive index in combination with a large imaginary part k of the refractive index. To achieve a superior reflectivity and to meet further conditions favourable for coating, the materials eligible as basic materials, therefore, should meet the refractive index requirements set forth below.

In another embodiment the basic material has a real part of the refractive index of 1.4 or less at the operating wavelength, preferably of 1.0 or less. In the case of materials having a higher real part of the refractive index, the multi-layer system has to be provided with too great a number of layers so as to achieve the high reflectivity desired. In such layer systems having, e.g., more than fifty single layers, frequently the problem occurs that layers delaminate, which is undesired.

In a further embodiment the basic material has an imaginary part of the refractive index of more than 1.5, preferably of more than 2.0 at the operating wavelength. The imaginary part of the basic material describing the absorption of the basic material at the operating wavelength should be chosen such that it is not too small according to the above specifications.

Alternatively, the basic material has a real and imaginary part of the refractive index of 3.0 or more at the operating wavelength. Rhenium is considered a suitable material having these properties, the refractive index of which has a real part of approx. 4.4 and an imaginary part of approx. 7.3 at 193 nm.

In one development, the basic material is selected from the group consisting of amorphous silicon, crystalline silicon, chromium, iridium, molybdenum, palladium, ruthenium, tantalum, tungsten, rhodium, rhenium, germanium and mixtures thereof. A common feature of these materials is that they have a melting point which is clearly higher than the melting point of aluminum such that a local fusing or a chemical reaction during irradiation and/or coating involving a high energy input may be precluded.

In a further embodiment the basic material is amorphous. Specifically in the case of silicon being used as the basic material as a rule it is difficult to generate a single-crystalline layer of the usual layer thickness of the basic material which is approx. 50-100 nm. By the way, the use of amorphous layers instead of crystalline layers does not have an adverse effect on the roughness and thus on the stray light characteristics of the optical element.

In a further embodiment, the multi-layer system comprises in between ten and fifty single layers, preferably in between twenty and forty single layers. With this number of single layers the required reflectivity may be achieved by making an appropriate selection of layer materials and layer thicknesses, without effects like delamination occurring due to the number of layers being too high.

It will be appreciated that both a substrate having superior thermal conductivity as described above and a basic material having a melting point exceeding that of aluminum may be combined in use, particularly when the melting point of the basic material does not considerably exceed the melting point of aluminum, such being the case, e.g., in germanium.

In a further embodiment, over at least a range of incident angles of 10°, preferably of 15°, the difference in the polarization-dependent reflectivity is at 5% or less, preferably at 2% or less and/or the polarization-dependent phase difference is less than 20°. Here, the range of incident angles indicates the difference between the minimum and the maximum incident angle of the useful light. Besides the generation of a high reflectivity, a polarization-dependent phase and/or reflectivity difference over the range of incident angles used which is as small as possible is another crucial criterion for the use of reflective optical elements in microlithography, which may be achieved by the measures described above.

In yet another embodiment the layer materials of the multi-layer system are selected from the group consisting of: oxides and fluorides. These materials are particularly suited for multi-layer systems in the UV wavelength range, wherein alternating layers from oxidic and/or fluoridic materials are typically used.

The layer materials of the multi-layer system may be selected from the group consisting of: aluminum oxide ($Al_2O_3$), aluminum fluoride ($AlF_3$), magnesium fluoride ($MgF_2$), silicon dioxide ($SiO_2$), erbium fluoride ($ErF_3$), neodymium fluoride ($NdF_3$), gadolinium fluoride ($GdF_3$), chiolithe ($Na_3Al_5F_{14}$), cryolithe ($Na_3AlF_6$), hafnium dioxide ($HfO_2$), tantalum pentoxide ($Ta_2O_5$), zirconium dioxide ($ZrO_2$), hafnium fluoride ($HfF_4$) and lanthanum fluoride ($LaF_3$). These materials have proven to be particularly suitable for layer systems having more than ten or twenty single layers, since, besides their superior optical properties they also hardly tend to delaminate which has a favourable effect on the durability of the multi-layer system, in particular, if a high number of layers is used.

In a further embodiment at least a single layer of the multi-layer system has a package density of 0.98 or more, preferably of 0.99 or more. The use of layers having such a package density has proven to be particularly advantageous, specifically for applications in microlithography. Such package densities usually may be attained only in using a coating method generating a high energy input which, as a rule, leads to the heating of the basic material, the impact of which may reduce the surface roughness of the basic material by the above-described measures.

In another embodiment the reflective layer of the optical element is curved. This is the case, e.g. with concave or convex mirrors used e.g. in catadioptric projection lenses for microlithography. The person skilled in the art will appreciate that it is possible to form a (111)-plane oriented reflective aluminum layer by epitaxial growth also on curved surfaces as long as the angle between the surface tangent and the orientation of the substrate (for example the orientation (111) of a cubic substrate) is less than 30°, preferably less than 20°.

Another aspect of the present invention is realized in a projection exposure apparatus for microlithography, comprising: at least one optical element as described above. One or more optical elements of the type described above may be arranged in an illumination system, beam delivery system and/or in a projection lens of a projection exposure apparatus. Favourably, the beam deflection mirror, specifically used in catadioptric projection lenses which are operated at high incident angles of 45° or more, can be configured according to the invention. Also, mirrors in the illumination system and/or the beam delivery system (the latter including a light source, typically a laser, for generating the UV radiation) can be configured according to the invention.

A further aspect of the invention is realized in a method of forming a reflective optical element of the above-mentioned type, comprising: forming the (111)-plane oriented reflective aluminum layer by heteroepitaxial growth, preferably on a base material having a hexagonal surface structure. In such a way, a reflective aluminum layer which is mainly (111)-plane oriented and which has a low surface roughness may be formed, the (111)-plane oriented aluminum layer having an increased reflectance, resulting in an increased overall reflectance of the optical element.

Yet another aspect of the invention is realized in a method of forming an optical element as described above, wherein application of at least a single layer of the multi-layer system is performed using a coating method generating an energy input of more than $0.1\ mJ/cm^2$, preferably of more than $10\ mJ/cm^2$, more preferably of more than $20\ mJ/cm^2$. Such an energy input—as described above—may lead to the heating of the basic material and thus to an alteration of the surface structure thereof. Nonetheless, the use of such coating methods is cost-effective, since the latter permit layers having a particularly high package density of more than 0.98, preferably of more than 0.99, to be applied, wherein a loss of reflectivity owing to the energy input may be precluded due to the measures described above. Specifically, the surface roughness may be at 3 nm rms or less, preferably at 2 nm rms or less even after application of a coating method with an energy input as mentioned above.

Less than six further single layers, preferably less than three further single layers, can be positioned between the single layer with energy input and the reflective layer in a variant of the invention. If the single layer having high energy input is arranged in the immediate vicinity of the basic material, this may lead to a particularly strong heating of the basic material, the effect of which may be compensated as described hereinabove.

In a further variant the coating method is selected from the group consisting of: sputtering, particularly, magneton sputtering or ion beam sputtering, and ion or plasma supported coating methods. The high energy inputted as described above into the deposited single layer and a superior package density is generated by these methods, wherein, as a rule, noble gases are used as inert gases incorporating themselves in the deposited single layers each and allowing the coating methods used to be evidenced.

Further features and advantages of the present invention will become apparent from the subsequent description of embodiments of the invention, of the drawings showing details essential to the invention, and the claims. The individual features may be realized in a variant of the invention either individually or collectively in any combination.

BRIEF DESCRIPTION OF THE DRAWINGS

Embodiments are illustrated in the schematic drawings and detailed in the description that follows.

DETAILED DESCRIPTION OF EXEMPLARY EMBODIMENTS

Figure 1:
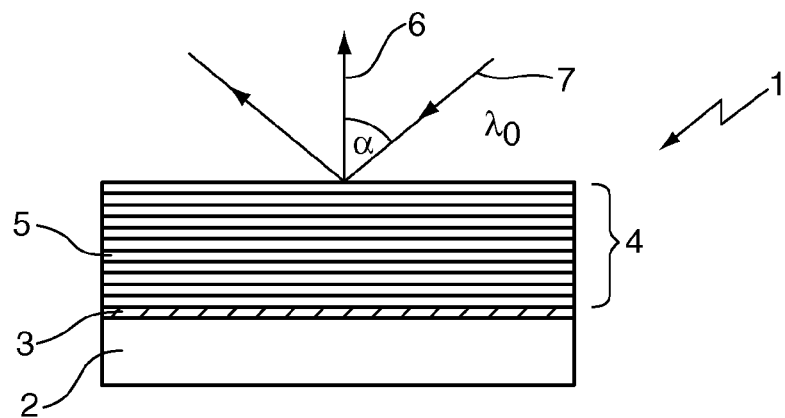
FIG. 1 shows a schematic illustration of a first embodiment of an optical element according to the invention with silicon being used as a basic material of a reflective layer.

In FIG. 1 an optical element 1 is shown schematically having a substrate 2 of quartz glass, onto which a layer 3 of amorphous silicon has been deposited as a basic material. A multi-layer system 4 is arranged on the layer 3 comprising a plurality of single layers. The fifth single layer 5 as viewed from substrate 3 has been deposited here by ion beam sputtering generating an energy input of approx. 10 mJ/cm² into single layer 5 in order to provide said single layer with a package density of more than 0.99. In the process the subjacent layer 3 consisting of silicon is heated. This heating, however, does not result in a noteworthy rearrangement of the atoms in the surface of silicon layer 3 due to the high melting point of silicon of approx. 1410° C. such that the said layer is not fused locally and has a roughness of less than 1 nm rms even though the single layer 5 and/or the multi-layer system 4 has been deposited.

Besides amorphous silicon, particularly crystalline silicon, chromium, iridium, molybdenum, palladium, ruthenium, tantalum, tungsten, rhodium, rhenium, germanium and mixtures thereof are suitable as basic material for layer 3 due to their high melting points and their optical properties (real and/or imaginary part of the refractive index). Contrary to this, if an aluminum layer had been used as a basic material, the energy input would have been sufficient to roughen the surface of the aluminum layer and thus to reduce the reflectivity of optical element 1, e.g. for light 7 incident at an operating wavelength $\lambda 0$ of 193 nm over a range of incidence $\alpha$ of approx. 45° vis-à-vis a normal vector 6 of the optical element 1. Since silicon has a real part of the refractive index of approx. 0.9 at 193 nm, which is distinctively larger compared to the refractive index of aluminum of 0.11, it is required to use a multi-layer system 5 having a large number of single layers, in the present example of 33 single layers, with aluminum oxide ($Al_2O_3$), aluminum fluoride ($AlF_3$) and lanthanum fluoride ($LaF_3$) being selected as layer materials. The sequence of the layers and the physical thickness thereof has been reproduced in the table below:

TABLE 1

| Layer Number | Physical Thickness (nm) | Layer Material |
|---|---|---|
| 1 | 44 | Al2O3 |
| 2 | 40 | AlF3 |
| 3 | 29 | Al2O3 |
| 4 | 40 | AlF3 |
| 5 | 29 | Al2O3 |
| 6 | 40 | AlF3 |
| 7 | 28 | Al2O3 |
| 8 | 41 | AlF3 |
| 9 | 28 | Al2O3 |
| 10 | 41 | AlF3 |
| 11 | 28 | Al2O3 |
| 12 | 41 | AlF3 |
| 13 | 28 | Al2O3 |
| 14 | 42 | AlF3 |
| 15 | 27 | Al2O3 |
| 16 | 43 | AlF3 |
| 17 | 27 | Al2O3 |
| 18 | 40 | AlF3 |
| 19 | 7 | LaF3 |
| 20 | 22 | Al2O3 |
| 21 | 41 | AlF3 |
| 22 | 9 | LaF3 |
| 23 | 20 | Al2O3 |
| 24 | 41 | AlF3 |
| 25 | 10 | LaF3 |
| 26 | 18 | Al2O3 |
| 27 | 42 | AlF3 |
| 28 | 31 | LaF3 |
| 29 | 41 | AlF3 |
| 30 | 31 | LaF3 |
| 31 | 43 | AlF3 |
| 32 | 28 | LaF3 |
| 33 | 42 | AlF3 |

It is understood that besides the material specified above, other, specifically oxidic or fluoridic materials, may be used for the single layers as well, e.g., magnesium fluoride ($MgF_2$), silicon dioxide ($SiO_2$), erbium fluoride ($ErF_3$), neodymium fluoride ($NdF_3$), gadolinium fluoride ($GdF_3$), chiolithe ($Na_3Al_6F_{14}$), cryolithe ($Na_3AlF_6$), hafnium dioxide ($HfO_2$), tantalum pentoxide ($Ta_2O_5$), zirconium dioxide ($ZrO_2$), and hafnium fluoride ($HfF_4$). Typically, the number of layers is in between ten and fifty or twenty and forty single layers.

Figure 2:
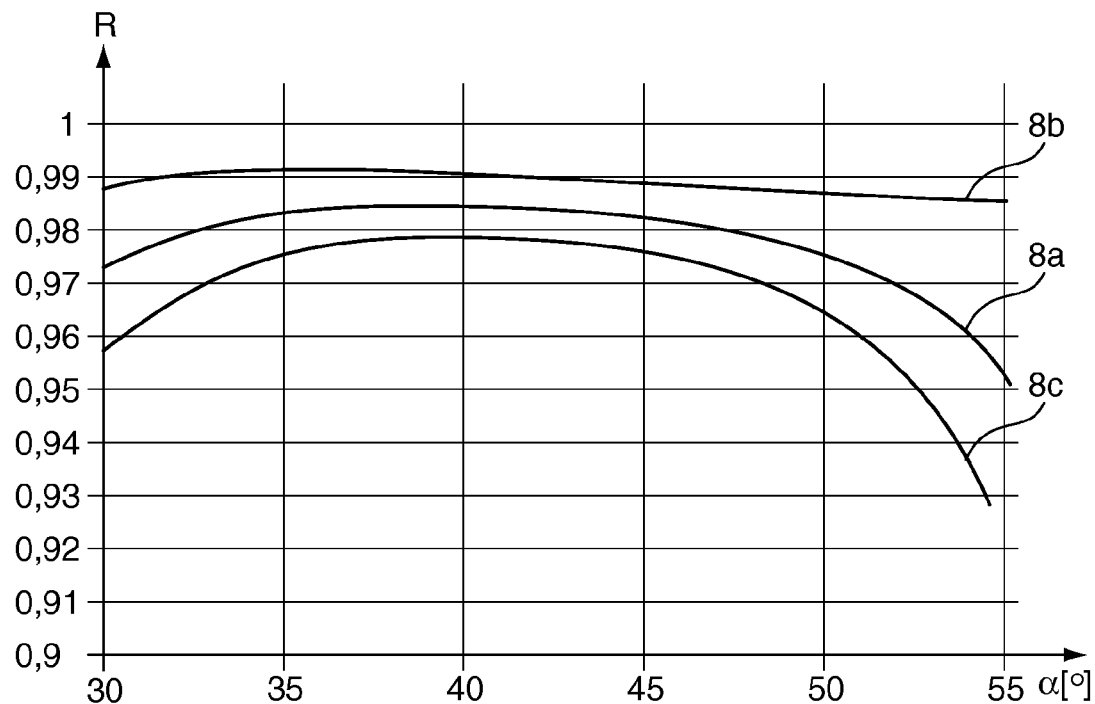
FIG. 2 shows the reflectivity of the optical element of FIG. 1 with respect to the incidence angle, FIGS. 3a,b show schematic illustrations of a second and third embodiment of an optical element according to the invention with a reflective aluminum layer having a (111) texture.

The reflectivity R of the optical element 1 to be achieved with the layer system depicted in Table 1 is shown in FIG. 2 for incident angles $\alpha$ between 30° and 55°. A first reflectivity curve 8a shows the reflectivity for both directions of polarization in a shared curve, whereas a second reflectivity curve 8b and a third reflectivity curve 8c show the reflectivity for the s- and/or p-polarized radiation portion. The overall reflectivity of the optical element 1 across the overall range of the incident angles shown is at more than 95%. Likewise, the polarization-dependent difference in reflectivity which is defined by the difference between the second and third reflectivity curve relative to the first reflectivity curve in the overall range of incident angles of 30° to 55° is less than 5%. Further, also the phase difference (not shown) between s- and p-polarized radiation component of the incident light 7 in the range of the incident angles shown is at less than 20°.

Figures 3A, 3B:
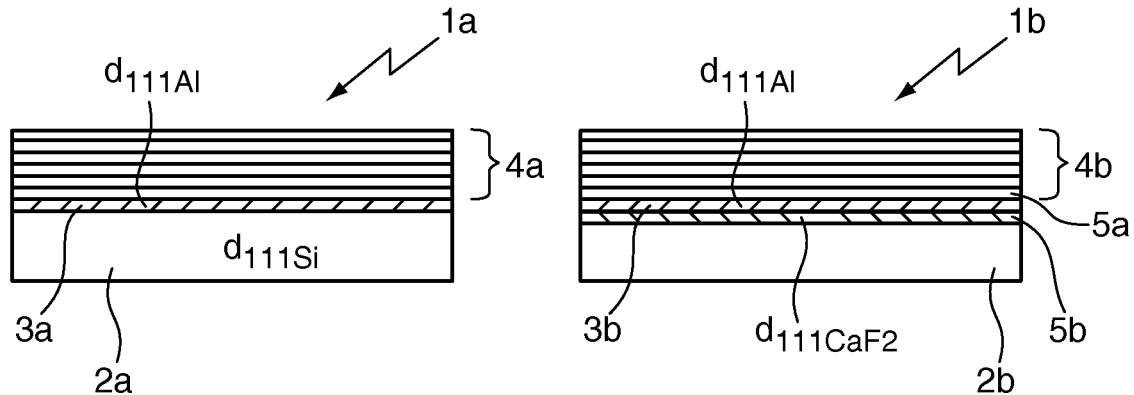

In the optical element 1 illustrated in FIG. 1, a basic material for the reflective layer 3 with a higher melting point than aluminum has been selected in order to achieve a reflectivity as high as possible when using an energy-rich coating method. Besides this approach, it is also possible to have the heat removed from the layer 3 comprising the basic material by suitably selecting a substrate material that is in contact with the material of the reflective layer, as illustrated in FIG. 3a. More specifically, FIG. 3a shows an optical element 1a having a substrate 2a of silicon, upon which a reflective layer 3a of aluminum is deposited. Both the reflective aluminum layer 3a and the silicon substrate 2a are (111)-plane oriented materials, i.e. among the peaks attributed to aluminum/silicon in X-ray diffraction, the peak intensity attributed to (111) planes is higher than the total of the other peak intensities attributed to aluminum/silicon. The aluminum layer 3a is formed on the silicon substrate 2a by epitaxial growth.

Typically, a (111)-plane oriented aluminum layer 3a may be grown on a base material (BM) with a hexagonal surface structure when the following condition holds:

$$0.9 < (nd_{111Al})/(md_{xxxBM}) < 1.1, \quad (1)$$

with n, m being integer values chosen from a range between 1 and 10 and $d_{111Al}$ and $d_{xxxBM}$ being the lattice constants of the hexagonal (111)-plane of aluminum and (xxx) being the plane of the base material which has a hexagonal structure. For a cubic base material, the (111)-plane has a hexagonal structure and typically the relation holds: $d_{111BM} = 2^{0.5} * c$, where c is the (cubic) lattice constant as defined in the literature. When a base material with a hexagonal lattice structure is used, the plane with the hexagonal structure is typically the (001)-plane or the (002)-plane.

Growing the aluminum layer 3a on the silicon substrate 2a is possible since condition (1) is satisfied for the lattice constant $d_{111Al}=573$ pm of the aluminum layer 3a and the lattice constant $d_{111Si}=768$ pm of the (cubic) silicon substrate 2a for n=4 and m=3, as (4×573 pm)/(3×768 pm)=0.995. Similarly, the condition (1) is satisfied for the lattice constants of (cubic) calcium fluoride ($d_{111CaF2}=772$ pm) and (hexagonal) lanthanum fluoride ($d_{002LaF3}=719$ pm), also for n=4 and m=3. For generating a hexagonal surface structure of the crystalline silicon substrate 2a, the substrate 2a can be cut along the (111)-plane.

The high reflectivity of the (111)-plane oriented aluminum layer 3a for UV radiation allows one to use a multi-layer system 4a for the optical element 1a which has a smaller number of layers as compared to the multi-layer system 4 of FIG. 1 for achieving a comparable reflectivity—also owing to the low refractive index (of 0.11 at 193 nm) of aluminum. Layer systems eligible for producing high reflectivity are known, e.g., from US 2006/0262389 A1 by the applicant, or from U.S. Pat. No. 6,310,905 B1 referred to above, which are both incorporated by reference to this application.

Moreover, as silicon has a thermal conductivity of 148 W/(K m), the heat may be removed much better when using a silicon substrate 2a as compared to the case of conventional substrate materials, like quartz glass having a thermal conductivity of 1 W/(K m). As a result, a drastic decrease of the reflectivity of the optical element 1a due to the irradiation with an intensive laser may be avoided. Moreover, layers of the multi-layer system 4a having a superior energy input may be deposited without noticeably increasing the roughness of the surface of the reflective layer 3a.

FIG. 3b shows an optical element 1b which differs from the optical element 1a of FIG. 3a in that the substrate 2b is made from amorphous quartz glass. As a (111)-plane oriented aluminum layer 3b typically cannot be formed directly on the amorphous substrate 2b, an interlayer 5b of (111)-plane oriented calcium fluoride ($d_{111CaF2}=772$ pm) is deposited on the substrate 2b, for example by sputtering in the way described in U.S. Pat. No. 7,331,695 B2 or by ion- or plasma supported deposition methods. The optical properties of the interlayer 5b are not important for the optical properties of the optical element 1b, as the aluminum layer 3b is applied with a sufficient thickness such that almost no UV radiation reaches the interlayer 5b. Moreover, the interlayer 5b made of calcium fluoride may be used to remove the heat from the aluminum layer 3a, as will be described below.

Figure 4:
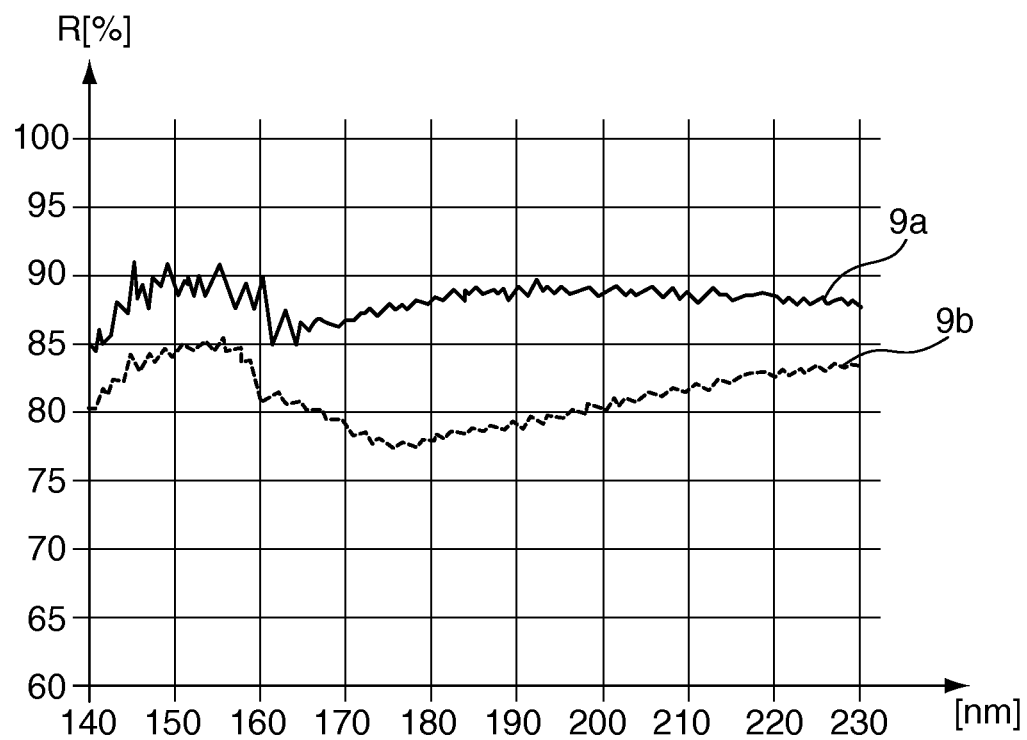
FIG. 4 shows the reflectivity of optical elements having two different substrates with respect to the wavelength.

FIG. 4 shows two reflectivity curves 9a, 9b, which were measured at an aluminum layer in dependence of the wavelength of the incident light. In the case of the first reflectivity curve 9a, the aluminum layer has been deposited onto a substrate of calcium fluoride (having a thermal conductivity of 11 W(K m)), in the second reflectivity curve 9b onto a substrate of quartz glass (Suprasil). It is clearly discernible that the reflectivity for the material having a higher thermal conductivity across the overall wavelength range shown is higher than for a material having the lower thermal conductivity. In order to further increase the laser durability of the aluminum layer 3b, a protective layer 5a made of chiolite is arranged on top of the aluminum layer 3b, forming the lowermost layer of the dielectric multilayer system 4b.

It will be appreciated that a substrate made of a material having a high thermal conductivity may not only be advantageously used in the case of aluminum serving as a basic material but also in the case of other basic materials, specifically in the case of the basic materials mentioned above. This is particularly favourable if the material used has a melting point which does not significantly exceed that of aluminum, which is the case, e.g., with germanium (melting point 937°).

The person skilled in the art will appreciate that instead of using plane substrates 2, 2a, 2b as shown in FIG. 1 and FIGS. 3a,b, it is also possible to use substrates with a curved surface for the deposition of the reflective layers 3, 3a, 3b, the application of (111)-plane oriented reflective layers made of aluminum also being possible in this case, as long as the angle between the surface tangent and the plane of the substrate with the hexagonal structure (for example the orientation (111) of a cubic substrate) is less than 30°.

Figure 5:
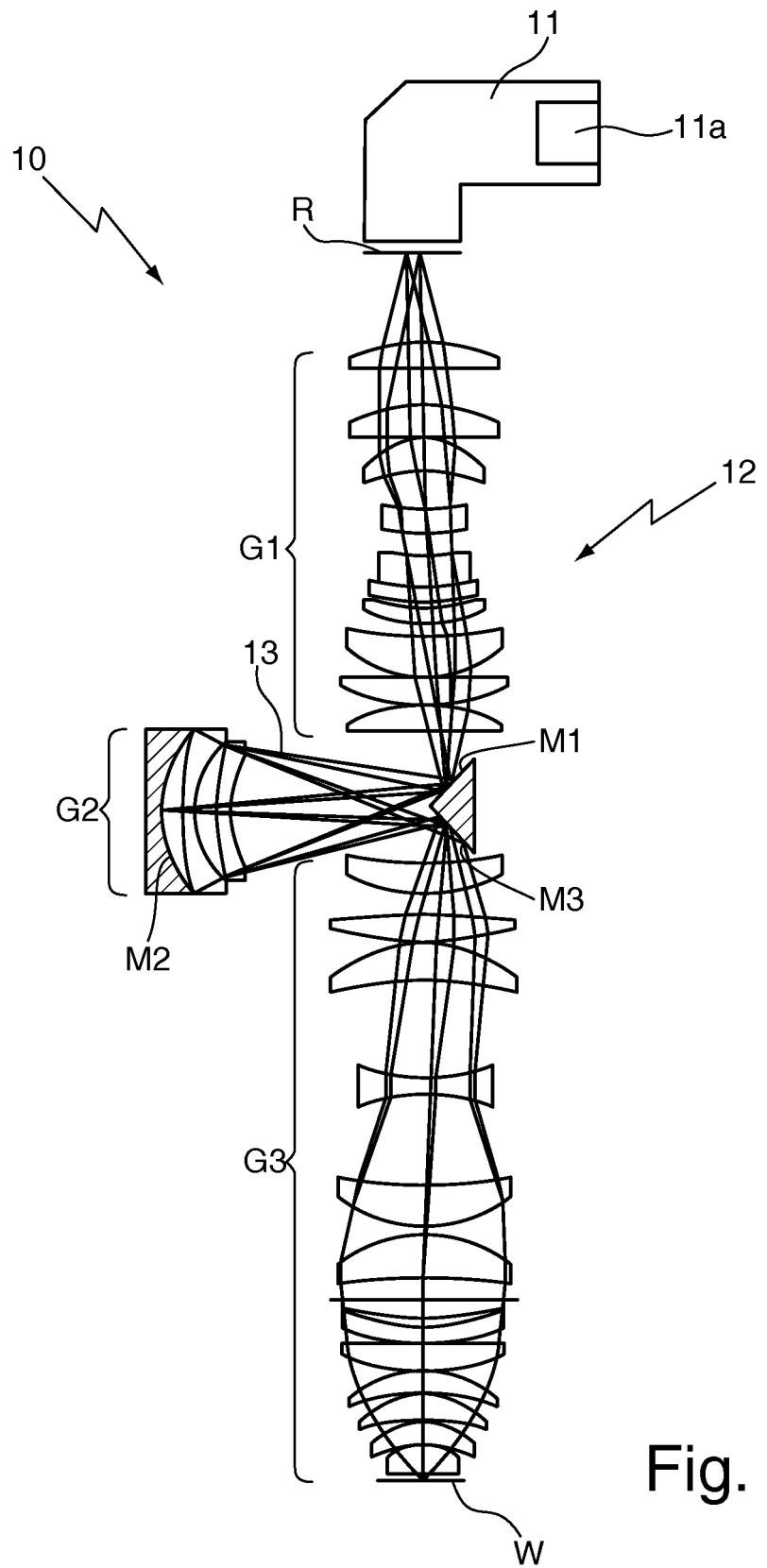
FIG. 5 shows an embodiment of a projection exposure apparatus for microlithography with embodiments of optical elements according to the invention.

The optical elements 1, 1a, 1b shown in FIG. 1 and FIGS. 3a,b may be used in a projection exposure apparatus 10 for microlithography as it is shown in FIG. 5. The projection exposure apparatus 10 has a beam delivery system 11a comprising a laser light source (not shown) for producing laser radiation at the operating wavelength $\lambda_0$ of 193 nm and an illumination system 11 for illuminating a mask arranged in a reticle plane R homogeneously. A subsequent projection lens 12 images a structure on the mask onto a photosensitive substrate which is arranged in a wafer plane W. The projection lens 12 is a catadioptric system with a concave reflector mirror M2 which is arranged in a beam path 13 between a first and a second (plane) deflection mirror M1, M3.

Further, the projection lens 10 has three image forming systems G1 to G3, comprising a plurality of optical elements each (lens elements), the arrangement and function of which are beyond the scope of the subject matter of the present invention and thus are not described herein; reference is made of WO 2004/019128 for a detailed description. Set forth below only the general characteristics of the image forming systems G1 to G3 are depicted.

The first dioptric image forming optical system G1 only comprises transmitting optical elements and is imaging the pattern in the reticle plane R onto a first intermediate image (not shown) which is in front of the first bending mirror M1. The second catadioptric image forming optical system G2 comprises the first deflective mirror M1 and the catadioptric part of projection lens 12 and is designed to form a second intermediate image from the first intermediate image. The second intermediate image is imaged by the third catadioptric image forming optical system G3 via the second deflective mirror M3 onto the wafer plane W. Those skilled in the art will recognize that the image forming optical systems have a pupil plane each with the concave reflector mirror M2 being arranged in the pupil plane of the second image forming optical system G2.

Both the first and the second deflective mirror M1, M3 and the concave reflector mirror M2 are configured as optical elements in one of the embodiments described above. In this manner, the advantageous characteristics of these optical elements, i.e., high reflectivity and moderate splitting of the polarization components into amplitude and phase may be put to use for UV and/or VUV microlithography. Further examples for projection lenses wherein the optical elements according to the invention may be put to use are described, e.g., in U.S. Pat. No. 6,665,126 for a catadioptric design with an intermediate image and two bending mirrors, and in WO 2005/069055 for a catadioptric design with two intermediate images. As far as the optical design of the imaging systems illustrated therein are concerned, all of the above-mentioned publications are incorporated by reference in this application.

It will be appreciated that the optical elements as described above may be used advantageously in beam delivery systems and illuminating systems of projection exposure apparatuses, as well as in other optical systems for the UV wavelength range.

The above description of various embodiments has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. An optical element configured to reflect ultraviolet radiation at an operating wavelength ($\lambda 0$) below 250 nm, comprising:
 a substrate,
 a reflective aluminum layer superimposed on the substrate, the reflective aluminum layer not being transparent to the ultraviolet radiation,
 wherein:
 the reflective aluminum layer is (111)-plane oriented,
 the reflective optical element has a reflectivity of more than 85% in a range of incident angles of at least 10° at the operating wavelength, and
 the reflective aluminum layer is superimposed on a base material having a hexagonal lattice structure with a (001)-plane or a (002)-plane forming a hexagonal surface structure.

2. The optical element according to claim 1, wherein a ratio between two integer multiples of the lattice constants ($d111Al$; $d111Si$, $d111CaF2$, $d002LaF3$) of the reflective aluminum layer in the (111)-plane and of the hexagonal surface structure of the base material differs by less than 10% from unity, the integer multiples of the lattice constants ($d111Al$; $d111Si$, $d111CaF2$, $d002LaF3$) being selected from a range of values between one and ten.

3. The optical element according to claim 1, wherein the base material is selected from the group consisting of: calcium fluoride ($CaF2$), silicon (Si), and lanthanum fluoride ($LaF3$).

4. The optical element according to claim 1, wherein the substrate is made of the base material.

5. The optical element according to claim 1, wherein an interlayer between the substrate and the reflective aluminum layer is made of the base material.

6. The optical element according to claim 1, wherein a dielectric multi-layer system is superimposed on the reflective aluminum layer.

7. The optical element according to claim 1, wherein a protective layer of chiolite ($Na5Al3F14$) is superimposed on the reflective aluminum layer.

8. The optical element according to claim 1, wherein the substrate has a thermal conductivity of at least 12 W/(K m).

9. A microlithographic arrangement comprising the optical element according to claim 1 and configured as at least one of: a projection exposure apparatus, an optical beam delivery system, an illumination system, and a projection lens.

* * * * *

UNITED STATES PATENT AND TRADEMARK OFFICE
CERTIFICATE OF CORRECTION

PATENT NO.         : 8,488,103 B2
APPLICATION NO.    : 12/780035
DATED              : July 16, 2013
INVENTOR(S)        : Alexandra Pazidis et al.

It is certified that error appears in the above-identified patent and that said Letters Patent is hereby corrected as shown below:

In the Drawings

Drawing Sheet 1, Fig. 2, lowest value on "R" axis: delete "0,9" and insert -- 0,90 --

In the Specification

Column 10, Line 54: delete "($Na_3Al_6F_{14}$)" and insert -- ($Na_3Al_5F_{14}$) --

In the Claims

Column 14, Line 3: In Claim 1, delete "($\lambda 0$)," and insert -- ($\lambda_0$) --

Column 14, Line 19: In Claim 2, delete "(d111Al; d111Si, d111CaF2, d002LaF3)" and insert -- ($d_{111Al}$; $d_{111Si}$, $d_{111CaF2}$, $d_{002LaF3}$) --

Column 14, Line 23: In Claim 2, delete "(d111Al; d111Si, d111CaF2, d002LaF3)" and insert -- ($d_{111Al}$; $d_{111Si}$, $d_{111CaF2}$, $d_{002LaF3}$) --

Column 14, Line 28: In Claim 3, delete "(CaF2)," and insert -- ($CaF_2$), --

Column 14, Line 29: In Claim 3, delete "LaF3" and insert -- $LaF_3$ --

Column 14, Line 39: In Claim 7, delete "Na5Al3F14" and insert -- $Na_5Al_3F_{14}$ --

Signed and Sealed this
Twentieth Day of May, 2014

Michelle K. Lee
*Deputy Director of the United States Patent and Trademark Office*